(12) United States Patent
Cohen et al.

(10) Patent No.: US 8,872,274 B2
(45) Date of Patent: Oct. 28, 2014

(54) STRUCTURE FOR SELF-ALIGNED SILICIDE CONTACTS TO AN UPSIDE-DOWN FET BY EPITAXIAL SOURCE AND DRAIN

(71) Applicant: International Business Machines Corporation, Armonk, NY (US)

(72) Inventors: Guy M Cohen, Mohegan Lake, NY (US); David J Frank, Yorktown Heights, NY (US); Isaac Lauer, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/197,762

(22) Filed: Mar. 5, 2014

(65) Prior Publication Data

US 2014/0183637 A1 Jul. 3, 2014

Related U.S. Application Data

(62) Division of application No. 12/750,342, filed on Mar. 30, 2010, now Pat. No. 8,716,091.

(51) Int. Cl.
*H01L 29/66* (2006.01)
*H01L 27/12* (2006.01)

(52) U.S. Cl.
CPC .................. *H01L 27/1203* (2013.01)
USPC ............ 257/386; 438/299; 438/300

(58) Field of Classification Search
USPC .................... 257/386; 438/299, 300
See application file for complete search history.

(56) References Cited

U.S. PATENT DOCUMENTS

| 2007/0096148 A1* | 5/2007 | Hoentschel et al. .......... 257/192 |
| 2007/0267698 A1* | 11/2007 | Bernstein et al. ............. 257/347 |
| 2007/0296002 A1* | 12/2007 | Liang et al. .................... 257/288 |
| 2008/0206977 A1* | 8/2008 | Frank et al. ................... 438/597 |

* cited by examiner

*Primary Examiner* — Daniel Whalen
(74) *Attorney, Agent, or Firm* — Michael J. Buchenhorner; Vazken Alexanian

(57) ABSTRACT

An upside-down p-FET is provided on a donor substrate. The upside-down p-FET includes: self-terminating e-SiGe source and drain regions; a cap of self-aligning silicide/germanide over the e-SiGe source and drain regions; a silicon channel region connecting the e-SiGe source and drain regions; buried oxide above the silicon channel region; and a gate controlling current flow from the e-SiGe source region to the e-SiGe drain region.

4 Claims, 11 Drawing Sheets

STRUCTURE FOR SELF-ALIGNED SILICIDE CONTACTS TO AN UPSIDE-DOWN FET BY EPITAXIAL SOURCE AND DRAIN

CROSS-REFERENCE TO RELATED APPLICATIONS

This application is a divisional of, and claims priority to, U.S. Ser. No. 12/750342, filed on Mar. 30, 2010, which applications is incorporated in its entirety herein.

FIELD OF THE INVENTION

The invention disclosed broadly relates to the field of microelectronics and more particularly relates to a design structure for upside-down field effect transistors.

BACKGROUND OF THE INVENTION

The higher density per unit area of microelectronic devices on a chip presents a challenge to reduce the parasitic capacitance between the gate conductor line and the metal filled vias that form the contacts to the device source and drain. This unwanted capacitance arises because of the close proximity of the metal filled vias and the gate line and becomes a significant detractor of the device speed when the device pitch is small. An upside-down field effect transistor ("UFET") is one way to address this challenge. A UFET is able to reduce the capacitance between the gate conductor line and the metal filled vias. An upside-down FET has the additional advantage of maintaining more of the strain induced in the channel by stress liners since the liner is not punctured by the contact via holes.

However, one major issue with known upside-down field effect transistor (UFET) structures is that the back-side contacts to the source and drain are not self-aligned to the source and drain regions of the device. In some proposed structures the contact vias are formed by etching through the source and drain silicon to contact the silicide layer. This presents a problem if the contact holes are misaligned. A failure may occur when part of the contact hole extends over a region not silicided.

There is a need for an improved device design to overcome the above-stated shortcomings of the known art.

SUMMARY OF THE INVENTION

Briefly, according to an embodiment of the present invention, an integrated circuit device includes: an upside-down p-FET on a donor substrate which includes the following: a silicon channel region connecting a SiGe source region and a SiGe drain region on each side of a channel; a buried oxide above the silicon channel region; a gate controlling a current flow from the source region to the drain region; a first stress liner underneath the gate to induce strain in the channel region; and wherein said at least portion of the source and drain regions are protruding out and above the buried oxide; wherein protruding surfaces of the source and drain regions are formed of silicide/germanide; a planaring dielectric disposed over the source and drain regions; and contacts formed through the planaring dielectric to the source and drain regions such that the first stress liner is not impinged.

BRIEF DESCRIPTION OF THE DRAWINGS

To describe the foregoing and other exemplary purposes, aspects, and advantages, we use the following detailed description of an exemplary embodiment of the invention with reference to the drawings, in which:

FIG. 2 shows the cross-sectional view of the exemplary p-FET device of FIG. 1 after the donor substrate is flipped upside-down and bonded to a host substrate, according to an embodiment of the present invention;

FIG. 3 shows the cross-sectional view of the exemplary p-FET device of FIG. 2 after the complete removal of the donor substrate, according to an embodiment of the present invention;

Figure 1:
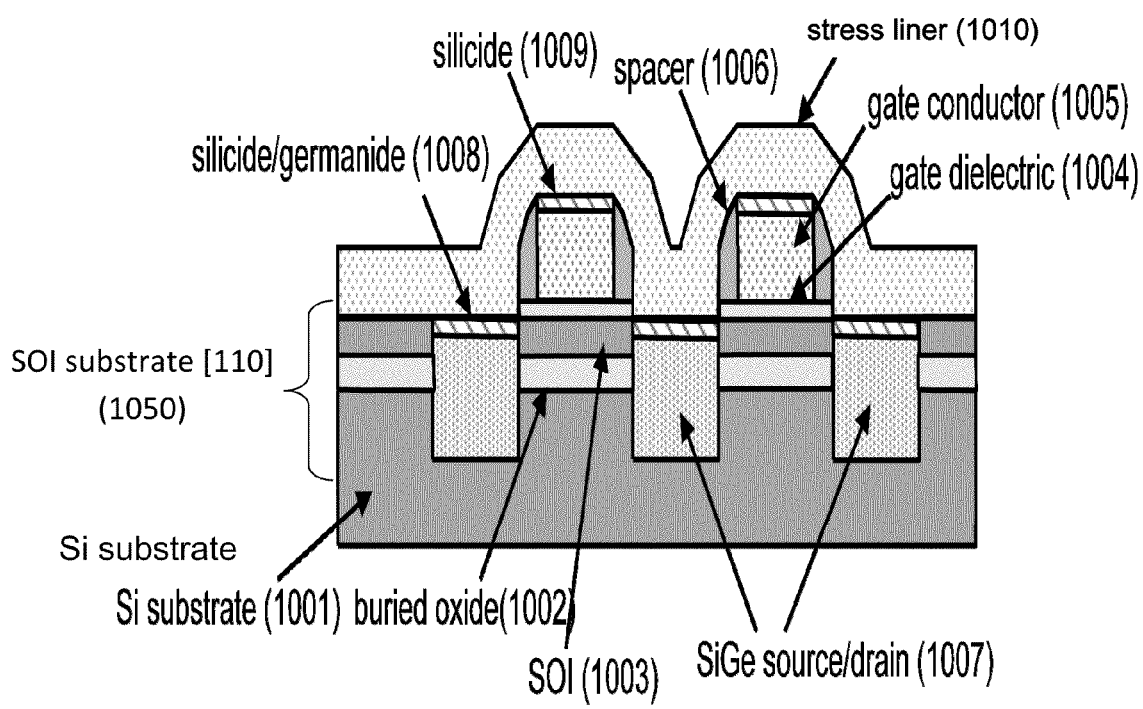
FIGS. 1-3 show cross-sectional views of an exemplary p-FET device, according to one embodiment of the invention.

While the invention as claimed can be modified into alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the scope of the present invention.

DETAILED DESCRIPTION

We describe an improved design structure and method to form field-effect transistors for semiconductors using self-aligned silicide contacts to the back-side of the source and drain regions, thus eliminating the need to form contact holes through the source and drain region. More specifically, the design includes self-aligned silicide/germanide (SiGe) ohmic contacts formed over the epitaxial SiGe source/drain regions of upside-down field-effect transistors. An ohmic contact is a contact between two materials which exhibit a linear and symmetric current-voltage (I-V) curve. In the following discussion "front-side" refers to the surface on which the integrated circuit devices are made prior to flipping over the FET, and "back-side" refers to the surface that is to become the top surface after the device is turned over.

An upside-down FET (UFET) according to the invention reduces the parasitic capacitance between the gate conductor line and the metal filled via that forms a contact to the source/drain. The parasitic capacitance is reduced because the metal-filled vias are no longer in proximity to the gate line. The UFET as described herein also has the advantage of maintaining more of the strain induced in the source/drain channel by stress liners since the liner is not punctured by the contact via holes. The stress liner is a film that has intrinsic stress when deposited over the device. The stress liner stress induces strain in the channel. Stress is measured as the force per unit area. Strain describes the deformation in the material and it measures the change in the size (contraction or elongation) of the material divided by its original size (length).

The invention uses epitaxial source and drain regions which contain at least in part a material such as silicon germanium (SiGe). These regions are formed by first etching the source and drain regions past the buried oxide (exposing the substrate) and then epitaxially growing the source and drain regions on the substrate with SiGe (for n-FETs only the bottom part of the epi source and drain contains Ge, and the top portion is Si). Epitaxy is a method of depositing a monocrystalline film on a monocrystalline substrate. The deposited film is denoted as an epitaxial layer or epitaxial film. When flipped over these source and drain regions are not etched when the excess silicon is etched to expose the buried oxide. A self-aligned silicide/germanide process can be used similarly to that used for the front-side. The contact holes (vias) are made to contact the back-side silicide.

Another advantage of the UFET design structure according to an embodiment of the invention is that the UFET can also be used to form a double gate structure. A second gate can be added over the back-side of the source/drain channel (after the device is turned over). Each of the gates, front-gate and back-gate, can be biased independently to control the source/drain channel.

Referring now to the drawings and to FIG. 1 in particular, we show two p-FET devices fabricated over a silicon-on-insulator (SOI) substrate 1050 according to the known art. The SOI substrate [110] 1050 comprises a silicon substrate 1001, a buried oxide 1002, and a single crystal SOI layer 1003. The SOI substrate 1050 is fabricated by well-established methods such as SmartCut™ or SIMOX (Separation by IMplanted OXygen). We note that the SOI substrate 1050 and the SOI layer 1003 preferably have the same crystal orientation, with a (100) oriented surface being the most preferable. The fabrication of the p-FET device initially follows the conventional fabrication steps including forming a thin gate dielectric layer 1004 over the SOI layer 1003, forming a gate conductor line 1005 over the thin gate dielectric layer 1004, and forming spacers 1006 adjacent to the gate conductor line 1005 sidewalls. Up to this point the device fabrication follows convention. From this point on, the disclosed fabrication process departs from the conventional process flow.

In a conventional embedded-SiGe (e-SiGe) process that is performed in SOI the SOI layer 1003 is partially etched in the source and drain regions to form a recessed region that is then filled up by epitaxial SiGe. The epitaxial SiGe, referred to as e-SiGe, replaces the device's source and drain regions. We emphasize that the SOI layer 1003 in a conventional design is partially etched (rather than fully etched) since the remaining SOI layer 1003 at the bottom of the recessed source and drain regions provides a template for the epitaxial growth of SiGe.

The major reason for the introduction of e-SiGe regions is to induce compressive strain in the channel region (the SOI film 1003 under the gate conductor 1005). As device sizes are scaled down, the SOI layer 1003 thickness is also reduced. As a result the e-SiGe thickness is also reduced, thus diminishing its effectiveness in inducing strain in the channel.

The disclosed process departs from the conventional e-SiGe process in the following manner: as shown in FIG. 1, e-SiGe source and drain regions 1007 are formed by fully etching the SOI layer 1003, including the buried oxide 1002, with some amount of etching of the substrate 1001, and then filling up the etched regions by epitaxial SiGe that templates from the substrate 1001. Since the total thickness of the e-SiGe regions 1007 is no longer limited by the SOI film 1003, a greater amount of strain can be induced in the channel region. The total thickness is no longer limited since the epitaxial source and drain has a total thickness that is larger than the SOI film thickness. Conventionally, the thinner the e-SiGe region is, the less strain it induces in the channel region.

The disclosed process continues with the conventional fabrication flow that includes formation of silicide/germanide (SiGe) 1008 over the source and drain region 1007 and a silicide 1009 over the gate conductor 1005 (this assumes doped poly-Si was used as the gate material), and the deposition of a stress liner 1010 to induce additional strain in the device channel. This is beneficial because higher compressive strain leads to higher hole mobility and therefore higher drive current. We note that in a conventional flow the stress liner 1010 would be interrupted by openings (referred to as via contacts) for contacting the source and drain regions. These openings in the stress liner 1010 typically reduce the strain induced by the stress liner 1010. Since the disclosed process contacts the source and drain regions from the backside (as will be explained below) the stress liner 1010 in this process is not compromised.

Figure 2:
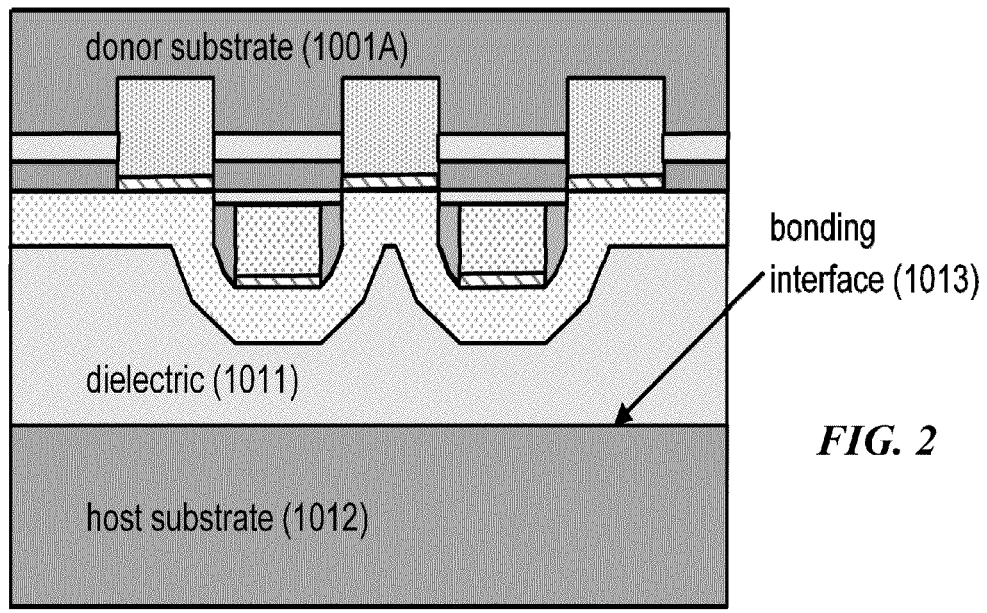

Referring now to FIG. 2, a dielectric film 1011 is blanket deposited over the stress liner 1010. The dielectric film 1011 may be formed of any suitable dielectric material, such as, inter alia: $SiO_x$, $Si_3N_4$, $SiN_xO_y$ including a low-k dielectric. The dielectric film may be formed by any suitable deposition process. The top surface of the dielectric film 1011 is planarized by a process such as chemical-mechanical polishing (CMP). In FIG. 2, the substrate 1001 is then flipped up-side down and bonded to a host substrate 1012. The substrate 1001, also referred to as the donor substrate, is then removed, leaving the top device region attached to the host wafer.

The bonding and removal of the donor substrate 1001 typically follows the following process steps: after planarization of the dielectric film 1011, a host substrate 1012 is brought into contact with the polished (planarized) surface of the dielectric film 1011. Since both surfaces are very flat and smooth, the wafers initially bond by van der Waals forces. The initial bonding between the surfaces is converted to a covalent bond (which is a much stronger bond) by annealing of the bonded wafers. Typical annealing temperature is about 400° C.-500° C., and the annealing time is several hours up to a day. Optional chemical treatment of the surface prior to bonding is also used to enhance the bonding strength.

The top surface of the host wafer is typically $SiO_2$ or silicon, but other materials including metals such as copper (Cu) where found to allow good bonding at relatively low temperatures.

Figure 3:
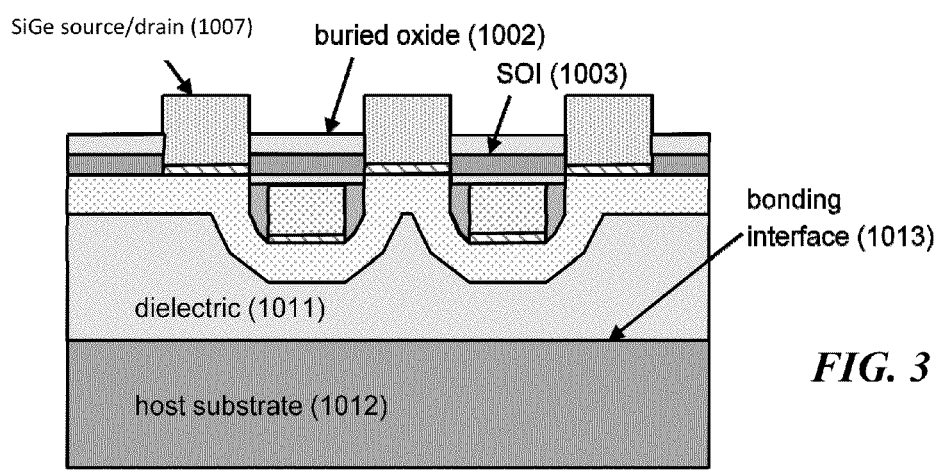

After bonding, the bulk part of the donor wafer is selectively removed by grinding, leaving about 2 to 10 microns of silicon 1001A, including the device structures. The remaining layer 1001A of the donor wafer is removed by selective etching of silicon with respect to the buried oxide 1002 and the SiGe 1007. An example of a wet silicon etching which is selective to oxide and to SiGe is TMAH. FIG. 3 shows the wafer after the complete removal of the donor substrate 1001. Other methods such as Smart Cut™ or polishing may be used for bonding and removal of the donor wafer.

Figure 4:
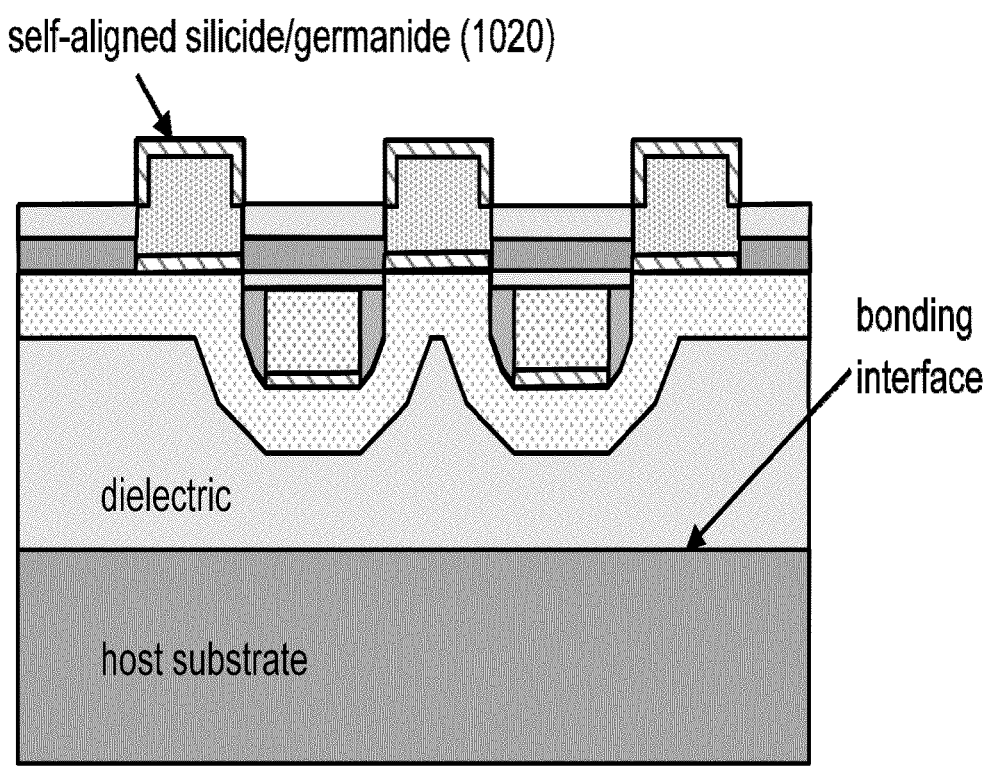
FIG. 4 shows the cross-sectional view of the exemplary p-FET device of FIG. 3 with a self-aligned silicide/germanide SiGe formed over the exposed top and sidewall surfaces of the SiGe source and drain region, according to an embodiment of the present invention.

As shown in FIG. 4, a self-aligned silicide/germanide SiGe 1020 is formed over the exposed top and sidewall surfaces of the SiGe source and drain 1007 regions. The silicide/germanide SiGe 1020 is formed by depositing a blanket metal film such as nickel (Ni) over the wafer, annealing the wafer to react the metal with the exposed SiGe source and drain 1007 surfaces, and selectively etching un-reacted metal from all of the dielectric (buried oxide) surfaces. As an example, the typical thickness of the blanket Ni film is 5 to 10 nm. A preferred annealing temperature which yields the mono-silicide/germanide phase is 400 to 450° C., and the annealing time is anywhere from 5 to 30 seconds.

Figure 5:
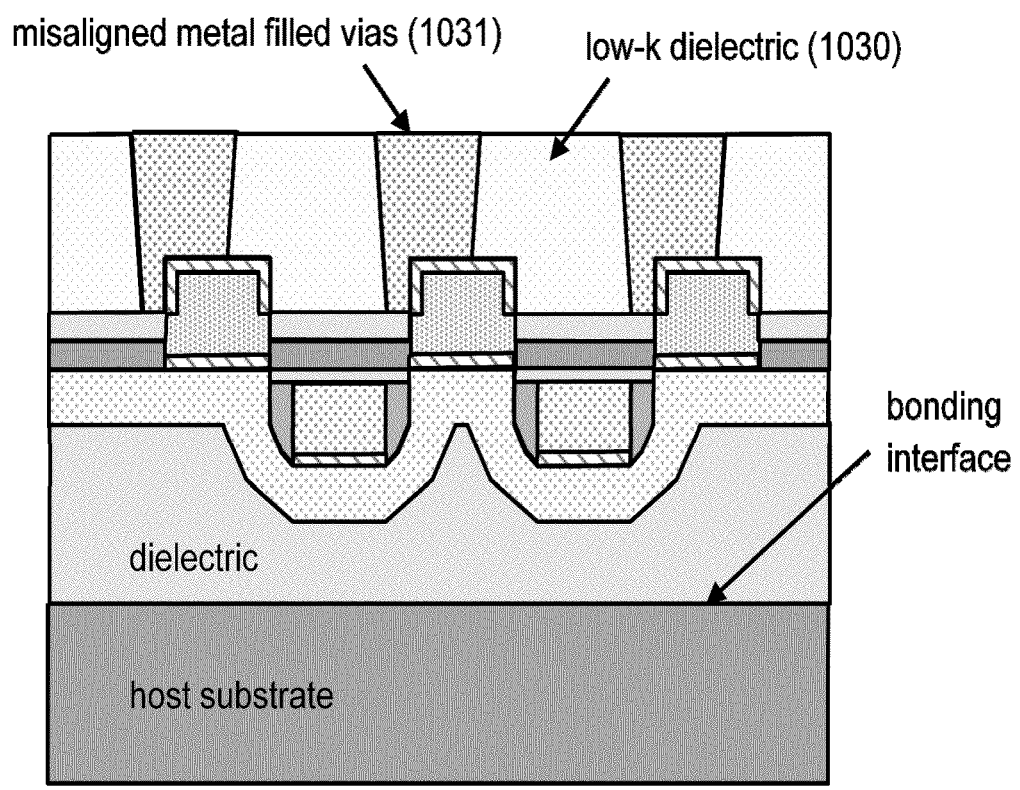
FIG. 5 shows a cross-sectional view of an exemplary p-FET with mis-aligned contacts, according to an embodiment of the present invention.

As shown in FIG. 5 a low-k dielectric film 1030 is deposited and polished back to form a planar surface. Contact openings (referred to as vias) are made in the low-k dielectric film 1030. These contact openings are then filled with a metal to form contacts 1031 to the silicide/germanide 1020 regions. As reflected in FIG. 5, we note that some misalignment of the contacts 1031 with respect to silicide/germanide 1020 is not critical since the latter are highly conductive and provide a good contact (good current spread) to the SiGe source and drain regions 1007.

Figure 6:
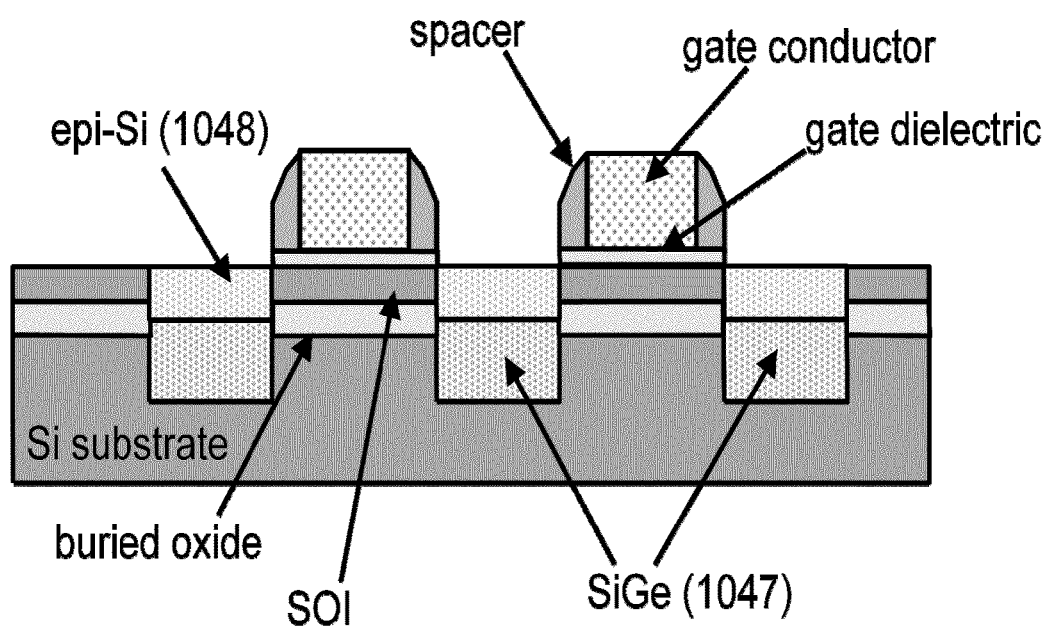
FIGS. 6-7 show cross-sectional views of an exemplary n-FET device, according to another embodiment of the invention.
Figure 12:
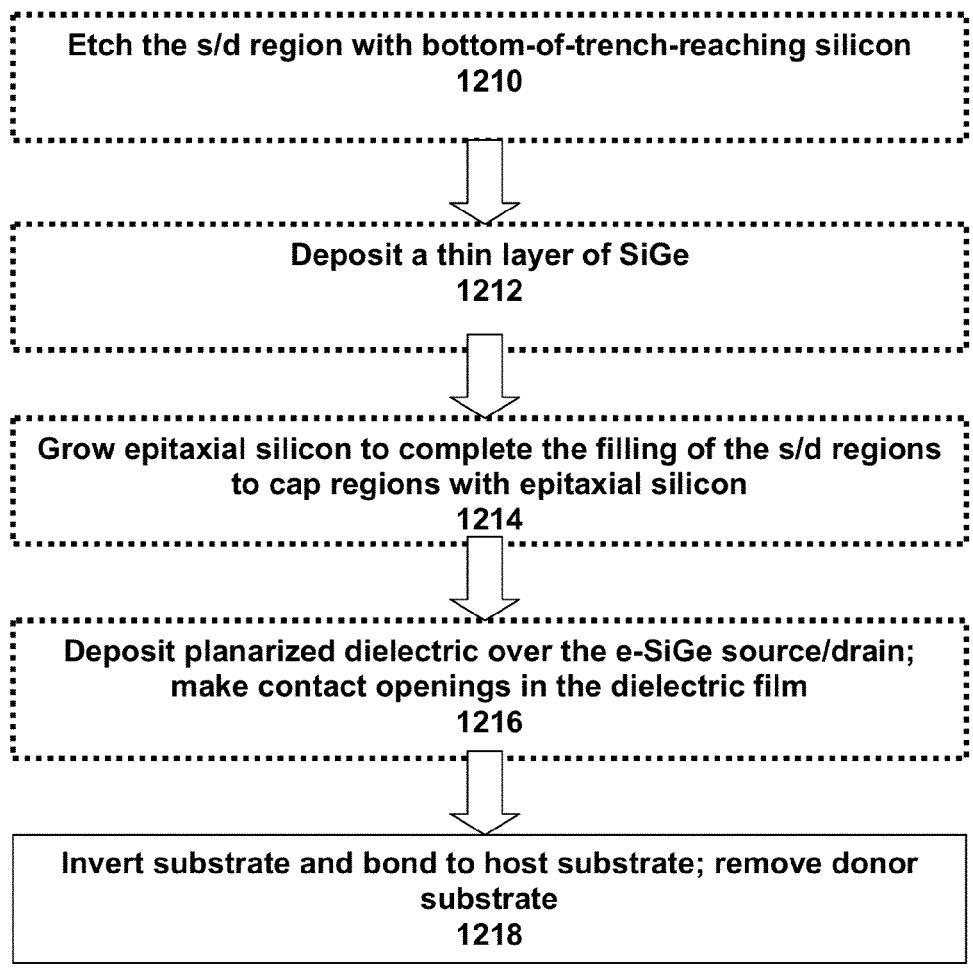
FIG. 12 is a flow chart showing the design process for an upside-down FET, according to another embodiment of the present invention.

FIG. 6 shows two n-FET devices that were fabricated over a silicon-on-insulator (SOI) substrate, according to another embodiment of the present invention. The process steps, shown in FIG. 12, are similar to that of the p-FET discussed in reference to FIG. 1, with the exception being the formation of the source and drain regions. The source and drain regions of the n-FET should not be made with epitaxial SiGe since it induces compressive strain in the channel. Instead, for an n-FET tensile strain is required in the channel to enhance the electron mobility.

Figure 7:
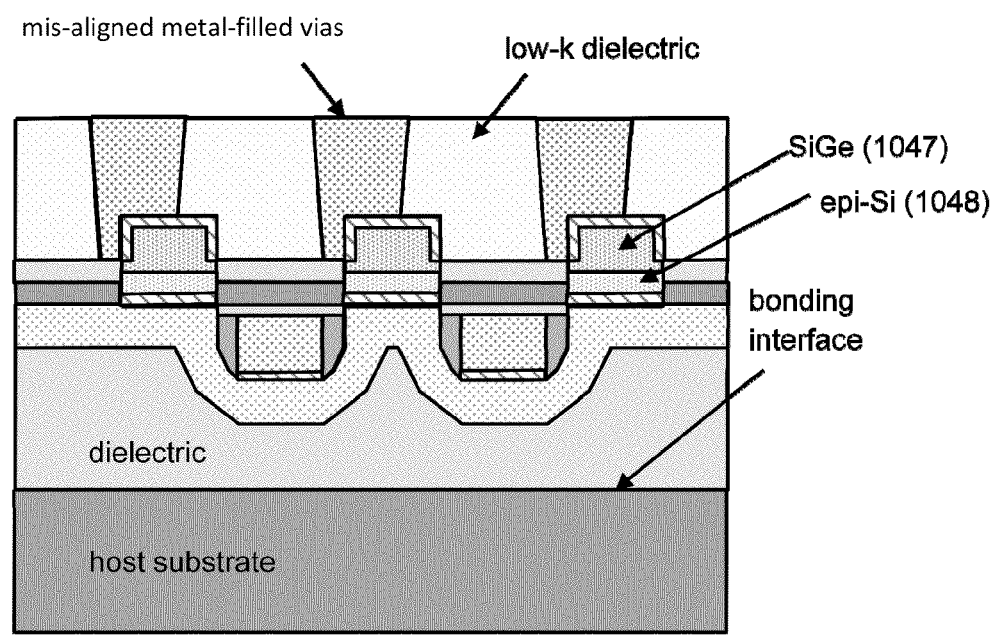
Figure 8:
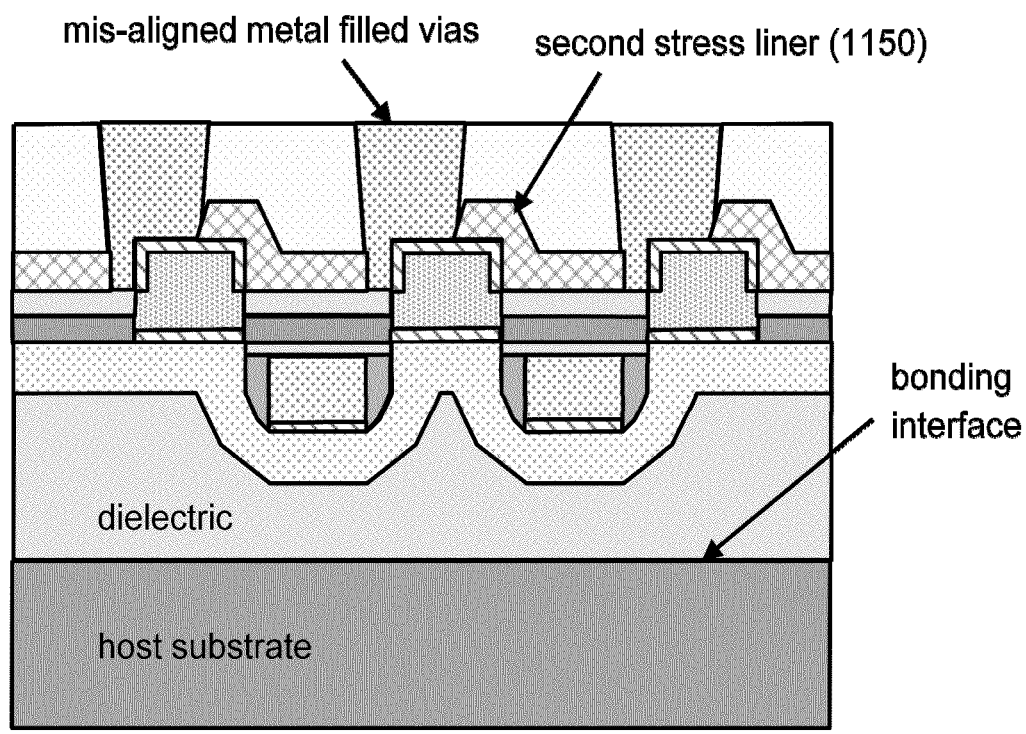
FIG. 8 shows a cross-sectional view of an exemplary FET where an additional stress liner was used; according to an embodiment of the present invention.

Referring now to FIG. 6, there is shown n-FET device after the fabrication of the source and drain regions. To fill the etched source and drain region a two step growth process is used: 1) A thin layer of SiGe 1047 is deposited first and then epitaxial Si 1048 is grown to complete the filling of the source and drain regions (epitaxial $Si_xC_{1-x}$ can also be used to induce tensile strain). Alternatively, it is possible to grow SiGe, and then recess the SiGe selectively with respect to Si and cap the recessed SiGe 1047 with epitaxial silicon 1048. Similar process steps discussed for the n-FET are taken to complete the device fabrication. The remainder of the process is the same as for the p-FET flow. A complete n-FET device is shown in FIG. 7. If e-SiGe for stress is not required then this process can be used for both n-FET and p-FET We note that additional straining of the FET channel can be achieved by using a second stress liner 1150 over the backside of the device as shown in FIG. 8. We note that the need for different strain polarity (compressive or tensile) in the p-FET and the n-FET channels may require the use of different stress liners for the p-FET and the n-FET. The stress liner 1150 also provides additional etch selectivity during the contact opening (via etch) step.

Figure 9:
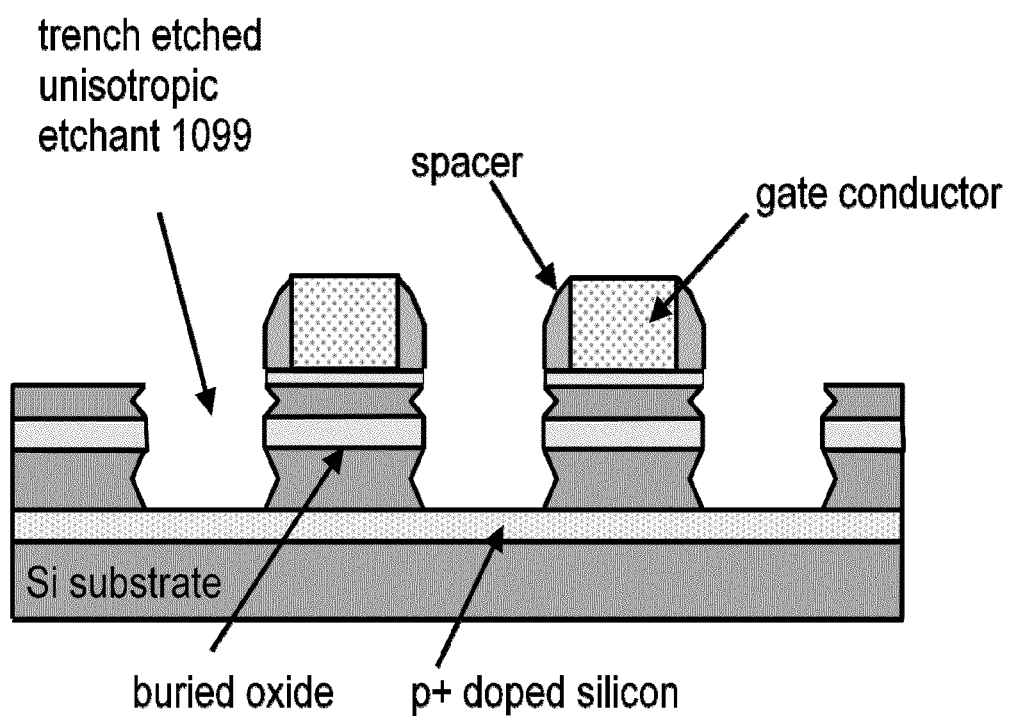
FIG. 9-10 show methods for addressing epi defects, according to embodiments of the present invention.
Figure 10:
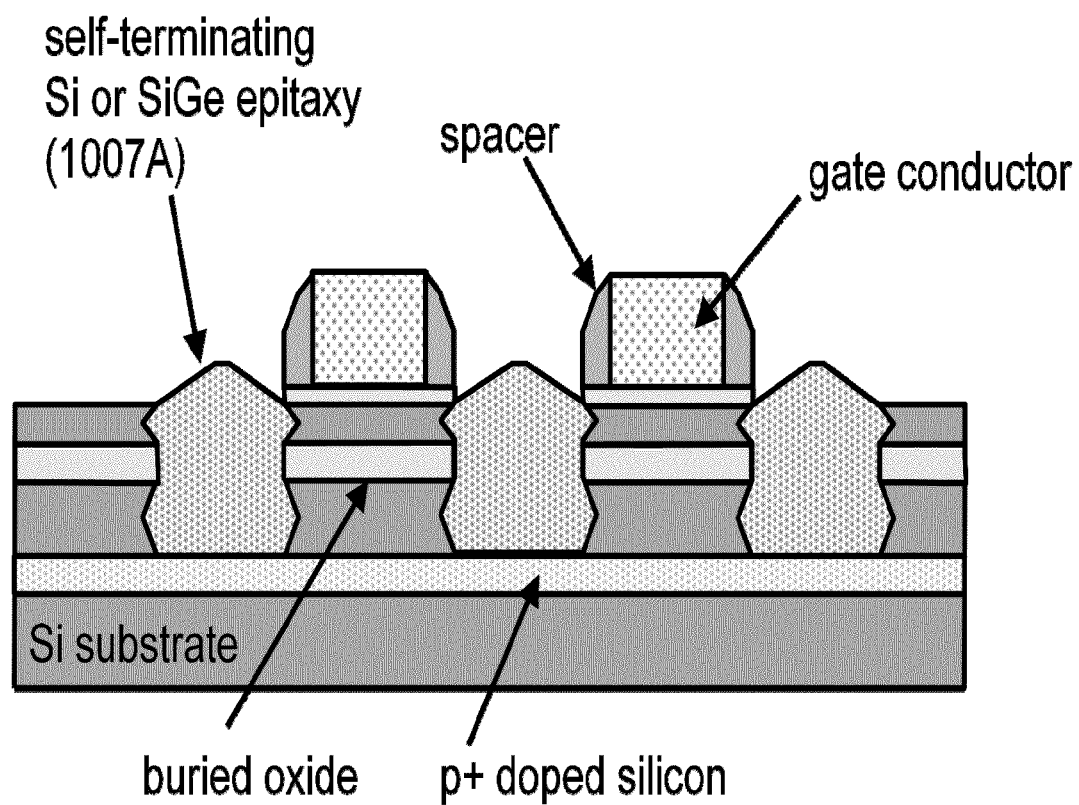

FIGS. 9-10 show additional methods to form the source and drain regions. Referring to FIG. 9, by forming a trench with [111] planes, growth from the trench sidewalls is eliminated. As will be explained later a trench with [111] planes helps to reduce epitaxial defects and also leads to a self-terminated growth. The formation of such a trench is done by first etching with RIE a trench with vertical sidewalls, and then TMAH (Tetramethylammonium hydroxide) is used to reveal the [111] planes. Since the TMAH etching rate is very slow for p+ doped Si it is used as a stop etch layer.

More specifically, by forming a trench 1099 with [111] sidewall planes it is possible to minimize defects in the epitaxial SiGe material, and additionally obtain a self-terminating growth of SiGe or Si 1007A (see FIG. 10).

Figure 11:
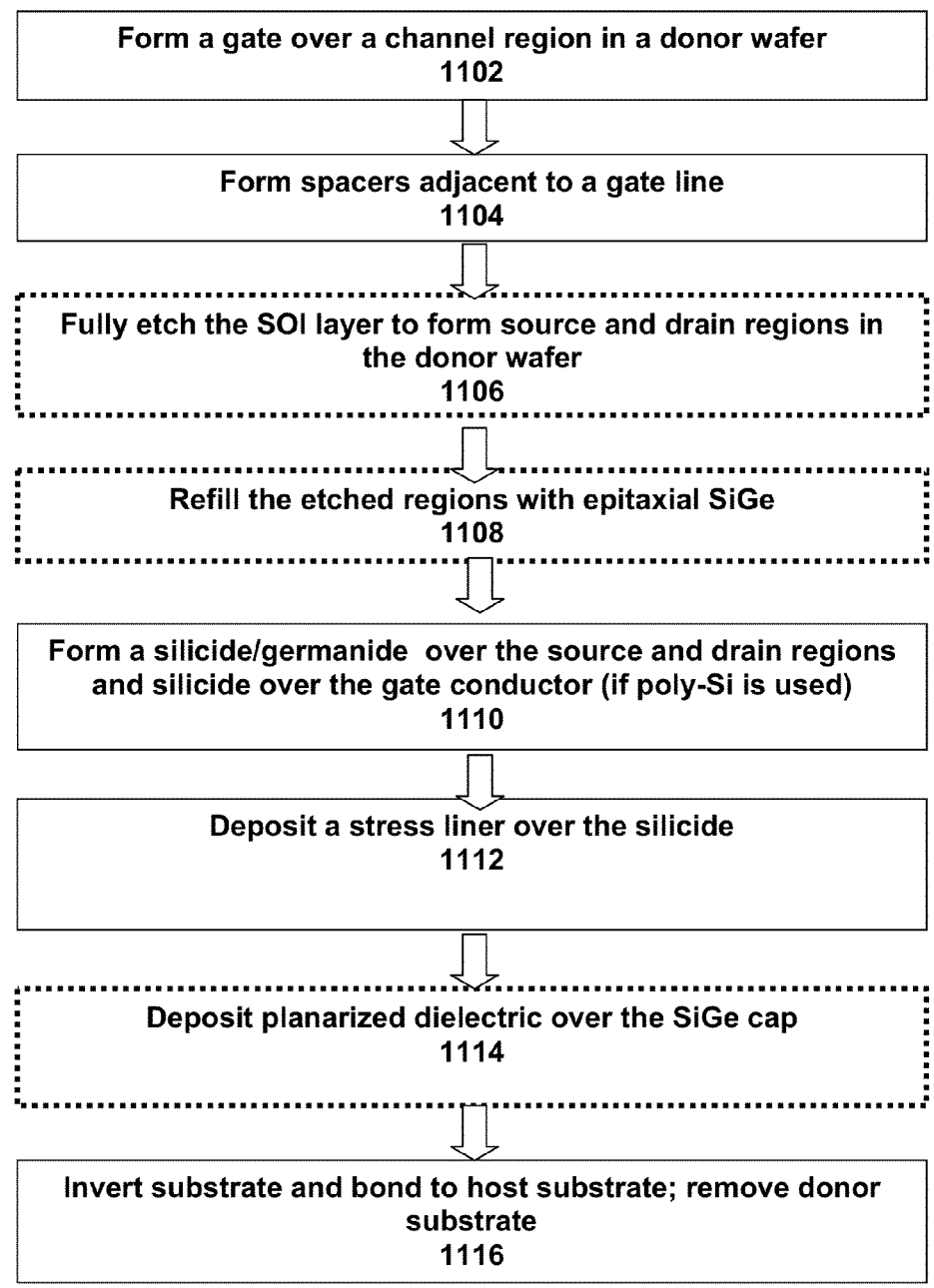
FIG. 11 is a flow chart showing the design process for an upside-down FET, according to an embodiment of the present invention.

Referring now to FIG. 11 there is shown a flow chart of the design process 1100 for the upside-down p-FET according to an embodiment of the present invention. The process begins in the conventional manner at step 1102 by forming a gate over a channel region in a donor wafer. Then, in step 1104 spacers are formed adjacent to a gate line. In step 1106 the process departs from the conventional design process by fully etching the SOI layer to form the source/drain regions in the donor wafer. The process steps that reflect the novelty of an embodiment of the invention are shown in dashed lines.

Then the etched regions are refilled with epitaxial SiGe in step 1108, following which a self-aligning silicide/germanide 1020 is formed over the source and drain regions in step 1110 (see FIG. 4). Additionally, silicide is applied over the gate conductor (if poly-Si is used). A stress liner is deposited over the silicide in step 1112. A dielectric film is deposited over the wafer and is planarized to facilitate wafer bonding in step 1114 (see FIG. 5). Lastly, the substrate is then flipped upside-down and bonded to the host substrate in step 1116. The donor substrate can be removed. At this point, an additional step of forming a self-aligning silicide/germanide on the exposed sidewalls of the e-SiGe source and drain regions is performed after exposing the source and drain regions.

FIG. 12 shows a flow chart of the design process 1200 for an n-FET, according to another embodiment of the present invention. Here we assume the same or similar process as described in steps 1102 through 1108 of FIG. 11. Then, beginning at step 1210, we etch the source/drain region with bottom-of-trench-reaching silicon. In step 1212 a thin layer of SiGe is deposited, followed by a growth of epitaxial silicon to completely fill the source/drain region. In this embodiment, the source/drain region should be capped with epitaxial silicon. Then the process continues in a similar manner to FIG. 11 with the planarized dielectric deposited in step 1216 and the substrate inverted and bonded in step 1218.

It should be noted that the design processes described with respect to FIGS. 11 and 12 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in the design process 1100 without deviating from the scope and spirit of the invention. Design processes 1100 and 1200 may also include modules for performing standard circuit design processes such as timing analysis, verification, design rule checking, place and route operations, etc.

What has been shown and discussed is a highly-simplified depiction of a design structure for integrated circuit fabrication. Those skilled in the art will appreciate that a variety of alternatives are possible for the individual elements, and their arrangement, described above, while still falling within the scope of the invention.

Therefore, while there has been described what is presently considered to be the preferred embodiment, it will understood by those skilled in the art that other modifications can be made within the spirit of the invention. The above descriptions of embodiments are not intended to be exhaustive or limiting in scope. The embodiments, as described, were chosen in order to explain the principles of the invention, show its practical application, and enable those with ordinary skill in the art to understand how to make and use the invention. It should be understood that the invention is not limited to the embodiments described above, but rather should be interpreted within the full meaning and scope of the appended claims.

We claim:

1. An integrated circuit device comprising:
   a donor substrate comprising a silicon substrate, a buried oxide, and a single-crystal silicon-on-insulator layer; and an upside down p-FET disposed on the donor substrate,
said upside-down p-FET comprising:
self-terminating e-SiGe source and drain regions;
a cap of self-aligning silicide/germanide over the e-SiGe source and drain regions;
a silicon channel region connecting the e-SiGe source and drain regions;
buried oxide above the silicon channel region;
a gate controlling a current flow from the e-SiGe source region to the e-SiGe drain region, said gate comprising a thin gate dielectric layer over the silicon-on-insulator layer and a gate conductor line over said thin gate dielectric layer;
a first stress liner deposited over the gate and the e-SiGe source and drain regions; and
wherein at least a portion of said e-SiGe source and drain regions and the buried oxide are exposed upon removal of the donor substrate.

2. The integrated circuit device of claim 1 further comprising:
contacts formed through the dielectric to the protruding e-SiGe source and drain regions such that the first stress liner is not impinged.

3. The integrated circuit device of claim 1 further comprising a low k-dielectric formed over the first stress liner.

4. The integrated circuit device of claim 1 further comprising a second stress liner disposed under the e-SiGe source and drain regions.

\* \* \* \* \*